(12) United States Patent
Hutton

(10) Patent No.: US 9,798,842 B1
(45) Date of Patent: Oct. 24, 2017

(54) CIRCUIT DESIGN INSTRUMENTATION FOR STATE VISUALIZATION

(71) Applicant: Altera Corporation, San Jose, CA (US)

(72) Inventor: Michael Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 318 days.

(21) Appl. No.: 14/611,031

(22) Filed: Jan. 30, 2015

(51) Int. Cl.
G06F 9/455 (2006.01)
G06F 17/50 (2006.01)

(52) U.S. Cl.
CPC .............. G06F 17/5031 (2013.01)

(58) Field of Classification Search
CPC ........ G06F 17/5031; G01R 31/318536; G01R 31/318541; G01R 31/318544; G01R 31/3177; G01R 31/318516; G01R 31/31816; G01R 31/31707; G01R 31/31724
See application file for complete search history.

(56) References Cited

U.S. PATENT DOCUMENTS 5,036,473 A 7/1991 Butts et al.
5,448,496 A 9/1995 Butts et al.
5,764,079 A * 6/1998 Patel .............. G01R 31/318516
326/16
6,240,376 B1 5/2001 Raynaud et al.
6,336,087 B2 1/2002 Burgun et al.
6,480,019 B2 11/2002 Waldie et al.
6,850,880 B1 2/2005 Beausoleil et al.
7,078,929 B1 7/2006 Draper et al.
8,689,068 B2 4/2014 Jain et al.
2015/0128001 A1* 5/2015 Raina ................. G01R 31/3177
714/726

OTHER PUBLICATIONS

Michael Hutton et al., U.S. Appl. No. 14/610,341 entitled "Techniques for Using Scan Storage Circuits," filed Jan. 30, 2015.

* cited by examiner

Primary Examiner — Nha Nguyen

(57) ABSTRACT

An integrated circuit may include observable storage circuits and unobservable or non-observable storage circuits. Among values stored in the observable and the non-observable storage circuits, only the values stored in the observable storage circuits are accessible for read-back and/or write-back operations during hardware emulation. A computer system may receive a circuit design that includes a design-under-test and implement at least a portion of the circuit design in the integrated circuit. The computer system may insert observable storage circuits into the circuit design and couple the observable storage circuits to the non-observable storage circuits such that the data stored in the non-observable storage circuits may be accessed during read-back operations using the inserted observable storage circuits.

20 Claims, 15 Drawing Sheets

CIRCUIT DESIGN INSTRUMENTATION FOR STATE VISUALIZATION

CROSS-REFERENCE TO RELATED APPLICATION

This application is related to U.S. patent application Ser. No. 14/610,341 entitled "Techniques For Using Scan Storage Circuits" and filed concurrently herewith, which is incorporated by reference herein in its entirety.

TECHNICAL FIELD

The embodiments presented herein relate to electronic circuits and, more particularly, to techniques for instrumenting a circuit design for state visualization.

BACKGROUND

Every transition from one technology node to the next technology node has led to more complex circuit design implementations in integrated circuits. Smaller transistor geometries have allowed potentially more functionality implemented per unit of integrated circuit area. At the same time, the costs of developing and manufacturing integrated circuits have also increased with every technology node. Therefore, integrated circuit developers want to verify that a gate-level representation of a circuit design behaves as defined in the design specification before manufacturing the integrated circuit. The goal is to locate and fix errors in the gate-level representation of the circuit design early such that expensive re-spins can be avoided or at least kept to a minimum.

Gate-level timing simulation has traditionally been used to perform this verification step. Gate-level timing simulation uses a test bench together with a software model of the circuit design to generate output responses to different input vectors. The test bench then compares these output responses with expected results. However, the execution time of gate-level timing simulation often exceeds any practical durations, especially for very big circuit designs that can include billions of gates. Hardware emulation or prototyping of circuit designs have emerged as a faster, more practical alternative to simulation.

Configurable integrated circuits such as programmable integrated circuits are often used as a platform for performing hardware emulation or prototyping of circuit designs. For this purpose, a circuit design description is compiled and implemented on one or more configurable integrated circuits and the test bench is executed on the one or more configurable integrated circuits. Verifying the gate-level representation of a circuit design using hardware emulation reduces execution time by several orders of magnitude compared to gate-level timing simulations.

SUMMARY

According to some embodiments, a computer system may receive a circuit design and implement a first portion of the circuit design with an integrated circuit. The integrated circuit may include observable storage circuits, which implement first sequential elements in the first portion of the circuit design, and a block with non-observable storage circuits. Among values stored in the observable and the non-observable storage circuits, only the values stored in the observable storage circuits are accessible using a scan chain with scan storage circuits.

It should be appreciated that the present invention can be implemented in numerous ways, such as a process, an apparatus, a system, a device, or a method on a computer readable medium. Several embodiments of the present invention are disclosed herein.

In certain embodiments, the above-mentioned computer system may implement a second portion of the circuit design in the block with non-observable storage circuits. As an example, the computer system may couple an additional observable storage circuit to an input of the block. The additional observable storage circuit may mirror a sequential element of the first sequential elements that is included in the second portion of the circuit design, and as such, the additional observable storage circuit may function as a shadow storage circuit. If desired, the computer system may couple the additional observable storage circuit in parallel to the input of the block. Alternatively, the computer system may couple the additional observable storage circuit in series with the input of the block.

If desired, the computer system may further disable operations that involve optimizations of the first sequential elements. For example, the computer system may disable operations such as retiming of sequential elements, merging of sequential elements, duplication of sequential elements, modification of initial conditions of sequential elements, and modification to clock enable signals that trigger sequential elements.

Further features of the present invention, its nature and various advantages, will be more apparent from the accompanying drawings and the following detailed description of the preferred embodiments.

DETAILED DESCRIPTION

Hardware emulation or prototyping of a circuit design often use a test bench together with a hardware implementation of the circuit design. Configurable integrated circuits such as programmable integrated circuits are often used as a platform for performing hardware emulation or prototyping of circuit designs. For this purpose, a circuit design may be compiled and implemented in one or more configurable integrated circuits. A test bench may be executed on those configured integrated circuits to generate output responses to different input vectors. The test bench may then compare these output responses with expected results. In certain embodiments, the configured integrated circuits may be used in real-world operating conditions with corresponding stimuli. As an example, a traffic manager design implemented on these integrated circuits may receive internet traffic as stimulus. If desired, the internet traffic may be slowed down to accommodate the potentially slower processing speed of the traffic manager design implementation in these integrated circuits.

For debugging purposes (e.g., to localize the source of an error), the execution of the test bench on the configured integrated circuits may be interrupted. Then, a read-back operation may extract the state of the synchronous elements (i.e., the value of the data stored in storage circuits such as registers, latches, memories, etc.) through debug ports such as the Internal Configuration Access Port (ICAP) or the Joint Test Action Group (JTAG) ports for further analysis.

The values of the data that is stored in synchronous elements of a first type may be accessible using scan storage circuits in one or more scan chains. These synchronous elements of the first type are sometimes also referred to as observable storage circuits. However, some synchronous elements (e.g., synchronous elements of a second type) may be accessible using a scan chain only through an observable storage circuit. Therefore, those synchronous elements are sometimes also referred to as unobservable storage circuits or non-observable storage circuits.

For debugging purposes, it is desirable that the read-back operation can extract the state of every synchronous element of the circuit design.

It will be recognized by one skilled in the art, that the present exemplary embodiments may be practiced without some or all of these specific details. In other instances, well-known operations have not been described in detail in order not to unnecessarily obscure the present embodiments.

Figure 1:
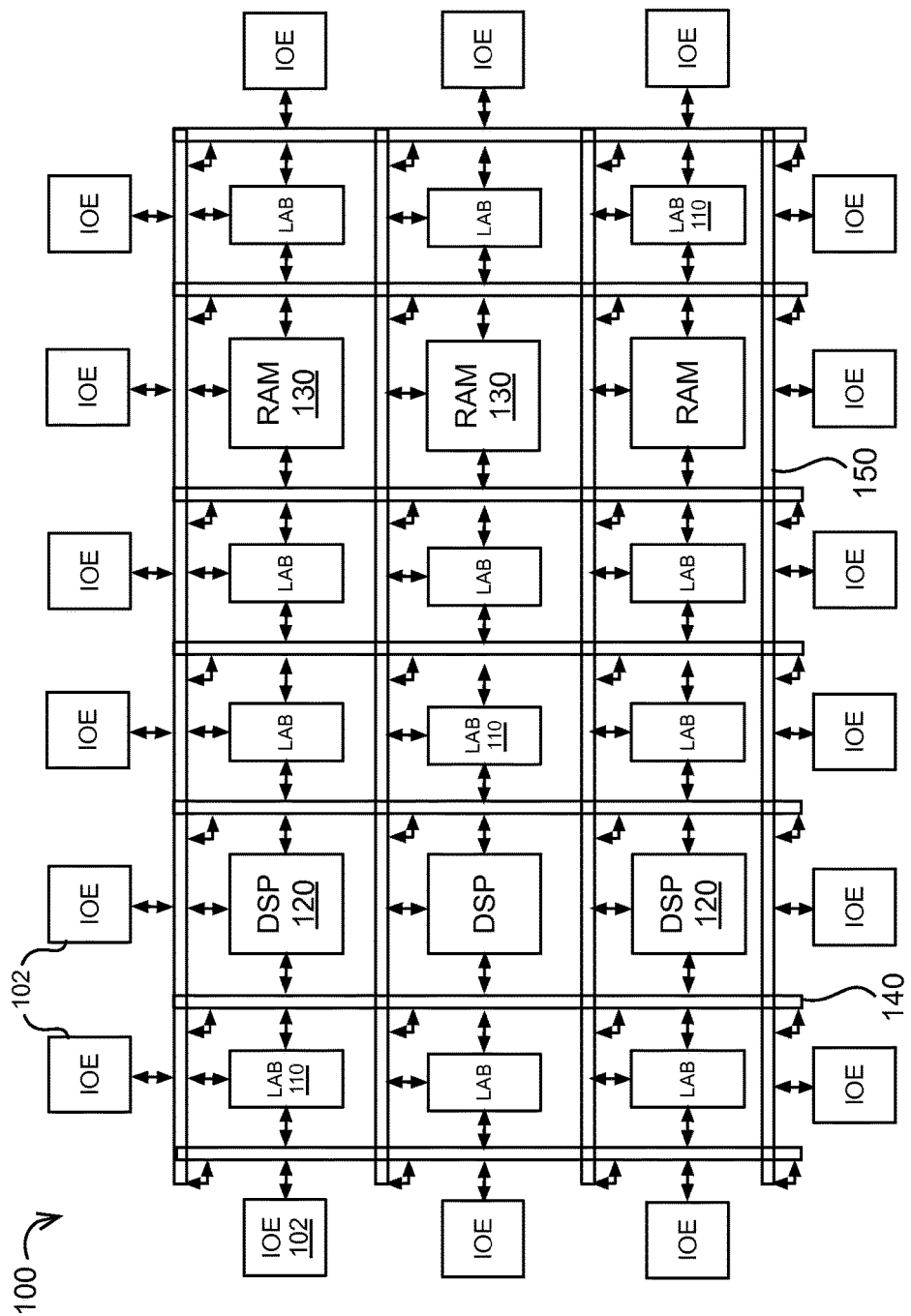
FIG. 1 is a diagram of an illustrative integrated circuit in accordance with an embodiment.

An illustrative embodiment of an integrated circuit such as programmable integrated circuit 100 that may be configured to implement a circuit design is shown in FIG. 1. As shown in FIG. 1, the programmable integrated circuit 100 may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

In addition, the programmable integrated circuit 100 may have input/output elements (IOEs) 102 for driving signals off of programmable integrated circuit 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable integrated circuit 100 may have input/output elements 102 arranged in different ways. For example, input/output elements 102 may form one or more columns of input/output elements that may be located anywhere on the programmable integrated circuit 100 (e.g., distributed evenly across the width of the programmable integrated circuit). If desired, input/output elements 102 may form one or more rows of input/output elements (e.g., distributed across the height of the programmable integrated circuit). Alternatively, input/output elements 102 may form islands of input/output elements that may be distributed over the surface of the programmable integrated circuit 100 or clustered in selected areas.

The programmable integrated circuit 100 may also include programmable interconnect circuitry in the form of vertical routing channels 140 (i.e., interconnects formed along a vertical axis of programmable integrated circuit 100) and horizontal routing channels 150 (i.e., interconnects formed along a horizontal axis of programmable integrated circuit 100), each routing channel including at least one track to route at least one wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of programmable integrated circuit 100, fractional global wires such as wires that span part of programmable integrated circuit 100, staggered wires of a particular length, smaller local wires, or any other suitable interconnection resource arrangement.

Furthermore, it should be understood that embodiments may be implemented in any integrated circuit. If desired, the functional blocks of such an integrated circuit may be arranged in more levels or layers in which multiple functional blocks are interconnected to form still larger blocks.

Other device arrangements may use functional blocks that are not arranged in rows and columns.

Programmable integrated circuit 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor field-effect transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory bits of the row that was designated by the address register.

In certain embodiments, programmable integrated circuit 100 may include configuration memory that is organized in sectors, whereby a sector may include the configuration RAM bits that specify the function and/or interconnections of the subcomponents and wires in or crossing that sector. Each sector may include separate data and address registers. Further information on sectors can be found in commonly-owned U.S. patent application Ser. No. 14/460,548, entitled "Programmable Circuit Having Multiple Sectors," which is hereby incorporated by reference herein in its entirety.

Figure 2:
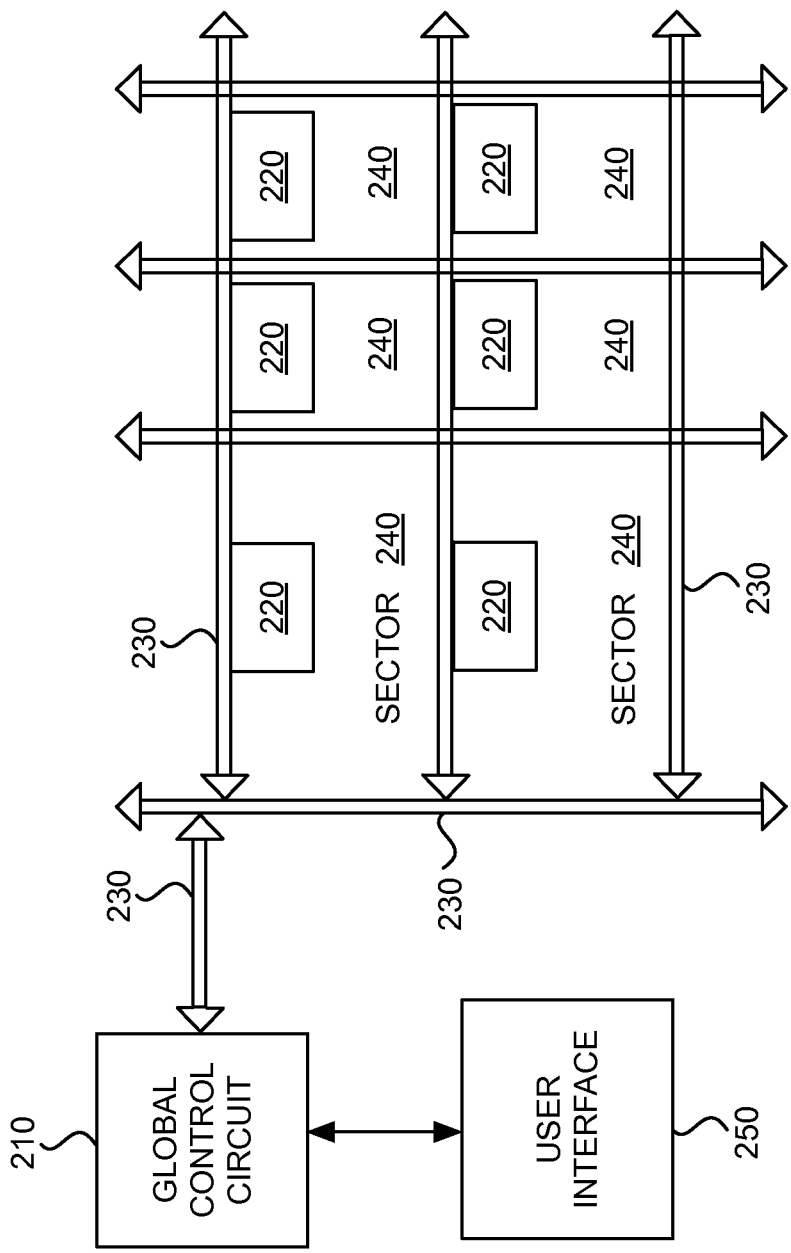
FIG. 2 is a diagram of an illustrative hardware emulation system with a user interface and a global control circuit that controls multiple sectors over a network in accordance with an embodiment.

FIG. 2 shows an illustrative configurable integrated circuit such as programmable integrated circuit 100 with configuration memory that is organized in sectors 240. Each sector 240 may include a local control circuit 220. These local control circuits may control the clock distribution networks and the configuration of the respective sectors 240. If desired, local control circuits 220 may manipulate and observe scan chains inside the respective sectors 240.

In certain embodiments, the local control circuits 220 may be implemented as state machines. In certain embodiments, the local control circuits 220 may be implemented as minimal processors. Each operation supported by local control circuits 220 may be implemented as a separate routine in a memory containing a control program.

In certain embodiments, this control program memory may receive and store new routines in order to implement new operations and functionality into the sectors. These new operations may increase the local activity within the sector. Without this extensibility, new functionality may need to be implemented in terms of pre-existing operations, which may increase the needed amount of communication between the global and local control circuits and prevent fully parallel use of the local control circuits 220.

Communication network 230 may connect local control circuits 220 to a global control circuit 210. If desired, communication network 230 may be implemented as a mesh-based network-on-chip (NoC). Further information on Networks-on-Chip and FPGAs can be found in commonly-owned U.S. Patent Application Publication No. 2014/0126572, "Programmable Logic Device with Integrated Network-on-Chip," which is hereby incorporated by reference herein in its entirety.

Global control circuit 210 may connect to device pins through which it can communicate with user interface 250. User interface 250 may include, for example, a JTAG scan chain, input/output ports, programmable logic circuits, or any combination of these circuits. Global control circuit 210 may receive commands from user interface 250, process the received commands, and send the processed commands to local control circuits 220 as required through communication network 230. In response to receiving commands from global control circuit 210, the local control circuits 220 may orchestrate the reading of the storage circuits in the respective sectors 240 and then send the data retrieved from the storage circuits back over communication network 230 to global control circuit 210.

Because global control circuit 210 is responsible for, among other things, coordinating the operations of the local control circuits 220, for communication between user interface 250 and the local control circuits 220, and for security features, global control circuit 210 (or at least a portion thereof) may be implemented in a processor as well. The processor may be a dedicated processor, special boot-up code for a user-visible processor already included in the device's design, or another suitable arrangement.

An advantage of the division into sectors may be that the local control circuits 220 may operate independently and in parallel. Each local control circuit 220 may retrieve data from its respective sector 240 using one or more scan chains in its respective sector 240, as disclosed in further detail below. In some embodiments, each of local control circuits 220 can filter the data retrieved from its respective sector 240 to a reduced set of data after discarding unneeded data. The local control circuits 220 may then transmit the reduced sets of data over communication network 230 to global control circuit 210. If each local control circuit 220 transmits data over communication network 230 at less than the maximum bandwidth of network 230, global control circuit 210 may determine a schedule for the local control circuits 220 to interleave data that is transmitted over network 230. Alternatively, global control circuit 210 may offer a timing schedule that allows the local control circuits 220 to transmit data over network 230 serially at the full bandwidth of network 230.

Global control circuit 210 may communicate with user interface 250 at a high data rate (e.g., through a high-speed serial interface (HSSI) transceiver circuit for example using the 10 Gigabit Ethernet protocol or the Peripheral Component Interconnect Express (PCIe) protocol, to name a few). Global control circuit 210 may communicate with the local control circuits 220 through a time-multiplexed communication network 230, for example, with each of the local control circuits 220 operating at a comparably lower rate but in parallel.

Each of the local control circuits 220 can monitor a first set of storage circuits in its respective sector 240 during a first time period, and a second set of storage circuits in its respective sector 240 during a second time period. The local control circuit's control program may be dynamically extended to perform this monitoring function. This monitoring function allows the set of storage circuits monitored at some point in time to be much larger than the number of bits sent from the sector over communication network 230 and global control circuit 210 to user interface 250 for external monitoring and interpretation. In addition, fixing a bug in a circuit design that requires altering the design implementation on the configurable integrated circuit (e.g., changing a logic AND to a logic OR) may require a local change that can be brought about using partial reconfiguration of the sector.

Figure 3:
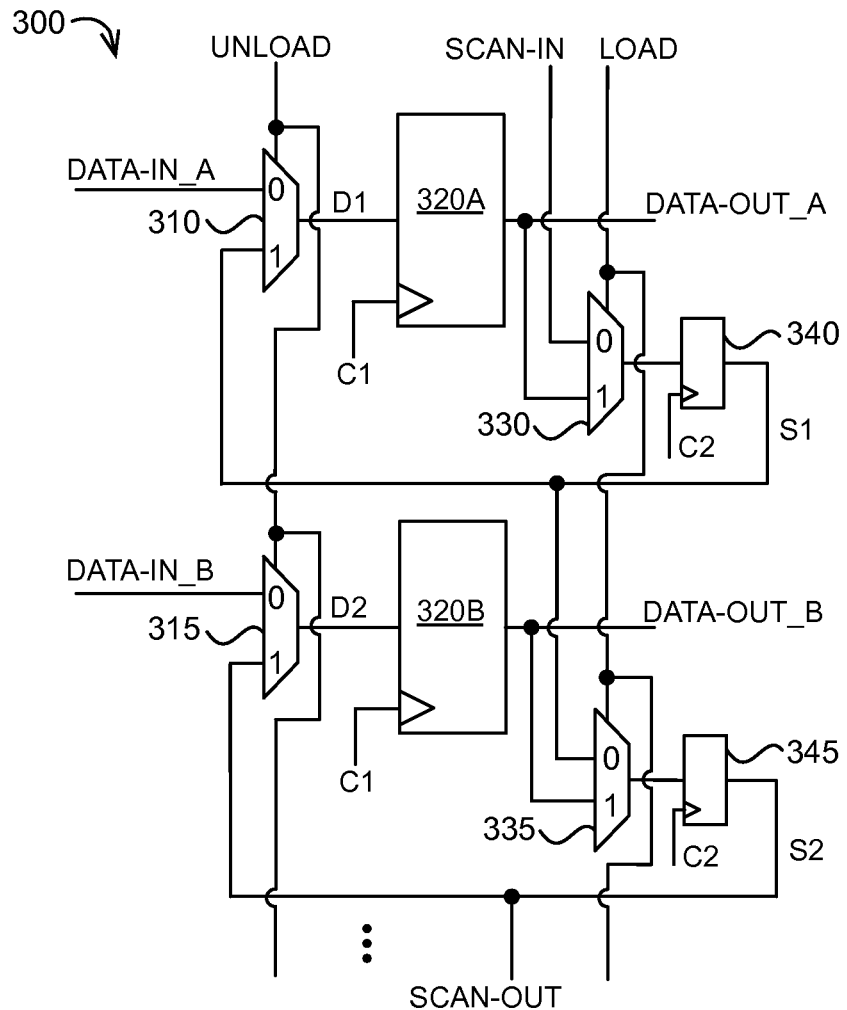
FIG. 3 is a diagram of an illustrative circuit that enables state capturing of user storage circuits using a scan chain in accordance with an embodiment.
Figure 3:
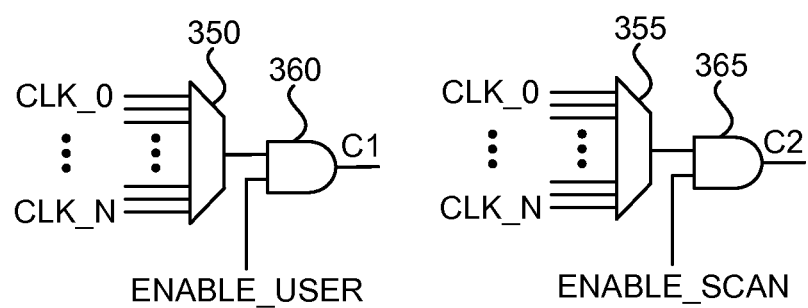

The independence of the sectors 240 may also result in shorter scan chains that are entirely contained within one sector and controlled by the respective local control circuit 220. In certain embodiments, the information about the states of user storage circuits may be retrieved using scan chains. FIG. 3 shows an illustrative circuit 300 that enables state capturing and state restoration of user storage circuits (e.g., user registers) using scan storage circuits (e.g., scan registers) that are arranged in a scan chain. Because user storage circuits 320A and 320B are accessible using scan storage circuits without traversing other storage circuits, user storage circuits 320A and 320B may be referred to as observable storage circuits.

As shown in FIG. 3, the scan chain includes scan storage circuit 340 and scan storage circuit 345. Multiplexers 330 and 335 couple together scan storage circuits 340 and 345 as a shift register in the scan chain when signal LOAD is '0.' The scan chain that includes scan storage circuits 340 and 345 is a dedicated scan chain that is used to capture and shift out data stored in user storage circuits 320A and 320B without shifting additional data into user storage circuits 320A and 320B. Thus, the scan chain that includes scan storage circuits 340 and 345 can perform a non-destructive capture of the data stored in user storage circuits 320A and 320B without disturbing or erasing the data stored in user storage circuits 320A-320B. Non-destructive capture of data stored in user storage circuits is also referred to as a snapshot or as state visualization.

A clock distribution network may use multiplexer 355 to select a clock signal among clock signals CLK_0, CLK_1, . . . CLK_N. Logic AND gate 365 may receive the clock signal from multiplexer 355 and signal ENABLE_S-CAN, which may enable or disable the clock signal. As an example, the output of logic AND gate 365 may be clock signal C2, which may trigger scan storage circuits 340 and 345.

Another clock distribution network may use multiplexer 350 to select a clock signal among clock signals CLK_0, CLK_1, . . . CLK_N. Logic AND gate 360 may receive the clock signal from multiplexer 350 and signal ENABLE_USER, which may enable or disable the clock signal. As an example, the output of logic AND gate 360 may be clock signal C1, which may trigger user storage circuits 320A and 320B.

In design execution mode, which is sometimes also referred to as user mode, user storage circuits 320A and 320B may receive data signals D1 and D2 from multiplexers 310 and 315, respectively. In this mode, signal UNLOAD may be de-asserted, and multiplexers 310 and 315 may select signals DATA-IN_A and DATA-IN_B as signals D1 and D2, respectively. User storage circuits 320A and 320B may store signals D1 and D2 at triggering events (e.g., rising edge, falling edge, high-level, low-level, or any combination thereof) of clock signal C1, and may provide the values of signals D1 and D2 as signals DATA-OUT_A and DATA-OUT_B, respectively.

If desired, a snapshot of the signals stored in user storage circuits 320A and 320B may be retrieved using the scan chain in data retrieval mode. Retrieving the signals stored in user storage circuits 320A and 320B is sometimes also referred to as operating circuit 300 in read-back mode. For this purpose, signals ENABLE_USER and ENABLE_SCAN may be de-asserted to halt clock signals C1 and C2, respectively. Signal LOAD may be set to '1' such that multiplexers 330 and 335 select the signals from user storage circuits 320A and 320B, respectively.

Signal ENABLE_SCAN may be asserted to allow one triggering event of clock signal C2. The one triggering event of clock signal C2 triggers scan storage circuits 340 and 345 to store the values stored in user storage circuits 320A and 320B, respectively. Then, signal LOAD may be switched from '1' to '0' to cause multiplexers 330 and 335 to select signals from other scan storage circuits on the scan chain. For example, multiplexer 335 selects the output signal S1 of scan storage circuit 340. Signal ENABLE_SCAN may then be asserted to start oscillations in clock signal C2. Scan storage circuits 340 and 345 then shift the stored data indicated by signals S1 and S2 out of the scan chain in signal SCAN-OUT at successive triggering events of clock signal C2.

If desired, signal ENABLE_USER may be asserted to start oscillations in clock signal C1. In response to oscillations in clock signal C1, user storage circuits 320A and 320B may operate in design execution mode, while the stored data are retrieved using the scan chain.

In an exemplary embodiment, the scan chain of FIG. 3 does not have direct connections to global routing conductors used to route signals between programmable logic blocks in the integrated circuit. Taking a snapshot of the data stored in the user storage circuits 320A-320B using the dedicated scan chain of FIG. 3 may allow for the removal of a global freeze signal and freeze logic that otherwise would be used to gate the global routing conductors.

In another embodiment, global control circuit 210 or the local control circuits 220 may have security logic that can disable read-back mode. The security logic can cause one or more of sectors 240 to enter a secure mode in which the ability of the scan chains in the respective sectors 240 to take snapshots of the data stored in the user storage circuits is disabled. The security logic can be used to ensure that the states of the user storage circuits that are programmed to be secure cannot be accessed in user mode. The security logic may, for example, be controlled by CRAM settings or fuses.

In another scenario, predetermined data may be written to user storage circuits 320A and 320B using the scan chain in data restoration mode. Writing predetermined data to user storage circuits 320A and 320B is sometimes also referred to as operating circuit 300 in write-back mode. For this purpose, signalLOAD may be set to '0' to cause multiplexers 330 and 335 to select signals from other scan storage circuits on the scan chain. Signal ENABLE_SCAN may be asserted to cause the predetermined data to be shifted into the scan chain via signal SCAN-IN. Scan storage circuits 340 and 345 store the predetermined data at their outputs as signals S1 and S2, respectively, in response to successive clock triggering events of clock signal C2.

Next, signals ENABLE_USER and ENABLE_SCAN may be de-asserted to halt clock signals C1 and C2, respectively. Signal UNLOAD may be set to '1' to cause multiplexers 310 and 315 to select the signals S1 and S2 from scan storage circuits 340 and 345 as signals D1 and D2, respectively.

Signal ENABLE_USER may be asserted for one triggering event of clock signal C1. The one triggering event of clock signal C1 may trigger user storage circuits 320A and 320B to store signals D1 and D2, respectively. As a result, user storage circuits 320A and 320B store the predetermined data from scan storage circuits 340 and 345, respectively. Then, signal UNLOAD may be set to '0' to cause multiplexers 310 and 315 to select signals DATA-IN_A and DATA-IN_B as signals D1 and D2, respectively. Signal ENABLE_USER may then be asserted to start clock signal C1, causing user storage circuits 320A and 320B to operate in design execution mode.

Figure 4:
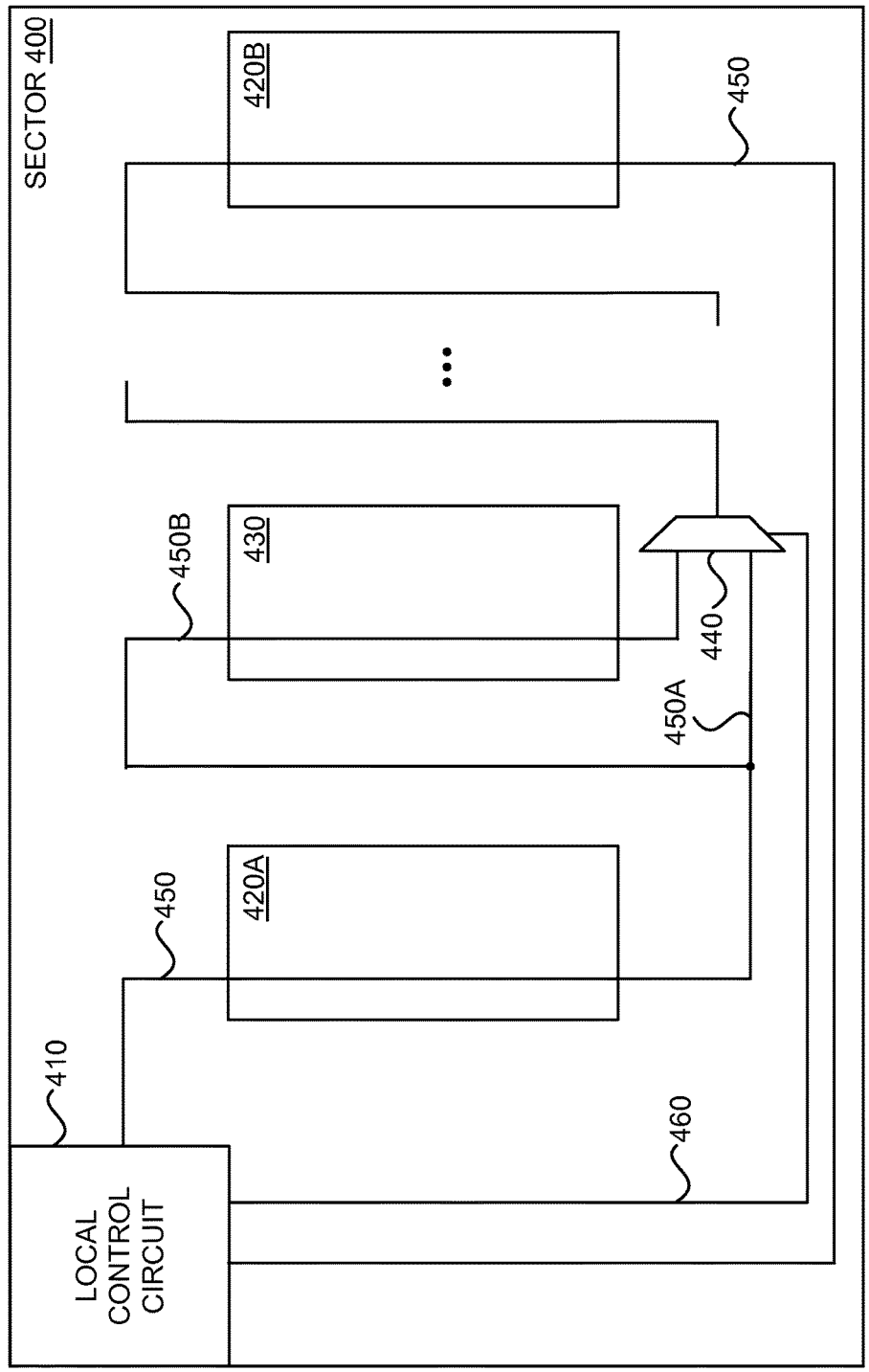
FIG. 4 is a diagram of an illustrative sector with scan chains that are controlled by a local control circuit in accordance with an embodiment.

If desired, a local control circuit (e.g., local control circuit 220 of FIG. 2) may control the scan chain. As an example, the local control circuit may control signals LOAD, UNLOAD, and ENABLE_SCAN. An illustrative embodiment of a sector (e.g., sector 240 of FIG. 2) with a local control circuit that controls a scan chain is shown in FIG. 4. As shown in FIG. 4, a sector 400 may include local control circuit 410, circuit blocks 420 that are of a first type (e.g., LAB 110, DSP 120, or RAM 130 of FIG. 1), and circuit blocks 430 of a second type (e.g., LAB 110, DSP 120, or RAM 130 of FIG. 1) that are different than the circuit blocks 420 of the first type.

Local control circuit 410 may control scan chain 450, which may originate in local control circuit 410, traverse circuit blocks 420A, 430, . . . , and 420B before terminating at local control circuit 410. Scan chain 450 includes portions 450A-450B. Scan chain 450 includes scan storage circuits, such as scan storage circuits 340 and 345. In some embodiments, scan chain 450 includes numerous scan storage circuits. If desired, sector 400 may include more than one scan chain. Each scan chain in sector 400 may originate and terminate in local control circuit 410, and local control circuit 410 may individually control each scan chain in sector 400.

As shown in FIG. 4, local control circuit 410 may control the scan chain 450 using connection 460 and multiplexer 440. For example, local control circuit 410 may direct multiplexer circuit 440 to select the signal on scan chain portion 450A from circuit block 420A at its first multiplexing input, thereby bypassing the scan chain portion 450B from circuit block 430 at its second multiplexing input.

Alternatively, local control circuit 410 may cause multiplexer 440 to select the signal on scan chain portion 450B from circuit block 430. For example, consider the scenario in which sector 400 is operated in hardware test mode. In this scenario, the goal may be to test the operability of all storage circuits in sector 400. In hardware test mode, local control circuit 410 may direct multiplexer 440 to select the signal on scan chain portion 450B at its second multiplexing input.

As another example, consider the scenario in which sector 400 is operated in hardware emulation or prototyping mode, and a user wants to probe the signals stored in circuit blocks 420 using scan chain 450, but not the signals stored in circuit blocks 430. In this scenario, local control circuit 410 may direct multiplexer 440 to select the signal on scan chain portion 450A at its first multiplexing input, bypassing the scan chain portion 450B from circuit block 430.

If desired, local control circuit 410 may be coupled to a global control circuit (e.g., as shown for local control circuit 220 of FIG. 2 that is coupled to global control circuit 210 over network 230). Local control circuit 410 may include filtering capabilities. The filtering capabilities may, for example, allow local control circuit 410 to monitor a subset of storage circuits in one or more of circuit blocks 420 and 430 during a first time period, and to monitor another subset of storage circuits in one or more of circuit blocks 420 and 430 during a second time period.

In embodiments in which local control circuit 410 includes a processor, the processor in local control circuit 410 may perform filtering of captured data using software. As an example, local control circuit 410 may remove sets of state according to user software code running on the processor. As another example, local control circuit 410 may orchestrate a snapshot of data from user storage circuits and perform diagnostic tests to determine whether the snapshot of the data should be abandoned or retained. Local control circuit 410 may, for example, abandon a snapshot once a circuit being tested is determined to be error free.

If desired, local control circuit 410 may individually retrieve data stored in one or more storage circuits, data stored in one or more storage circuits that are located in one or more circuit blocks, or data stored in one or more storage circuits that are coupled to one or more scan chains in sector 400. Local control circuit 410 may retrieve data stored in one or more storage circuits located in an adaptive logic module (ALM) in sector 400, data stored in one or more storage circuits located in a logic array block (LAB) in sector 400, data stored in one or more storage circuits located in a memory element in sector 400, and/or data stored in one or more storage circuits located in a digital signal processor (DSP) block in sector 400. An adaptive logic module (ALM) includes combinatorial logic such as a look-up table. Local control circuit 410 may buffer and/or process the retrieved data. Local control circuit 410 may provide the retrieved data to global control circuit 210 via network 230. Global control circuit 210 may package the retrieved data and transmit the packaged data externally via user interface 250.

When operating an integrated circuit in hardware emulation or prototyping mode, the design-under-test (DUT) circuit that is implemented on the integrated circuit may be encapsulated by wrapper circuitry. An embodiment of an illustrative integrated circuit with a DUT and wrapper circuitry is shown in FIG. 5A.

Figure 5A:
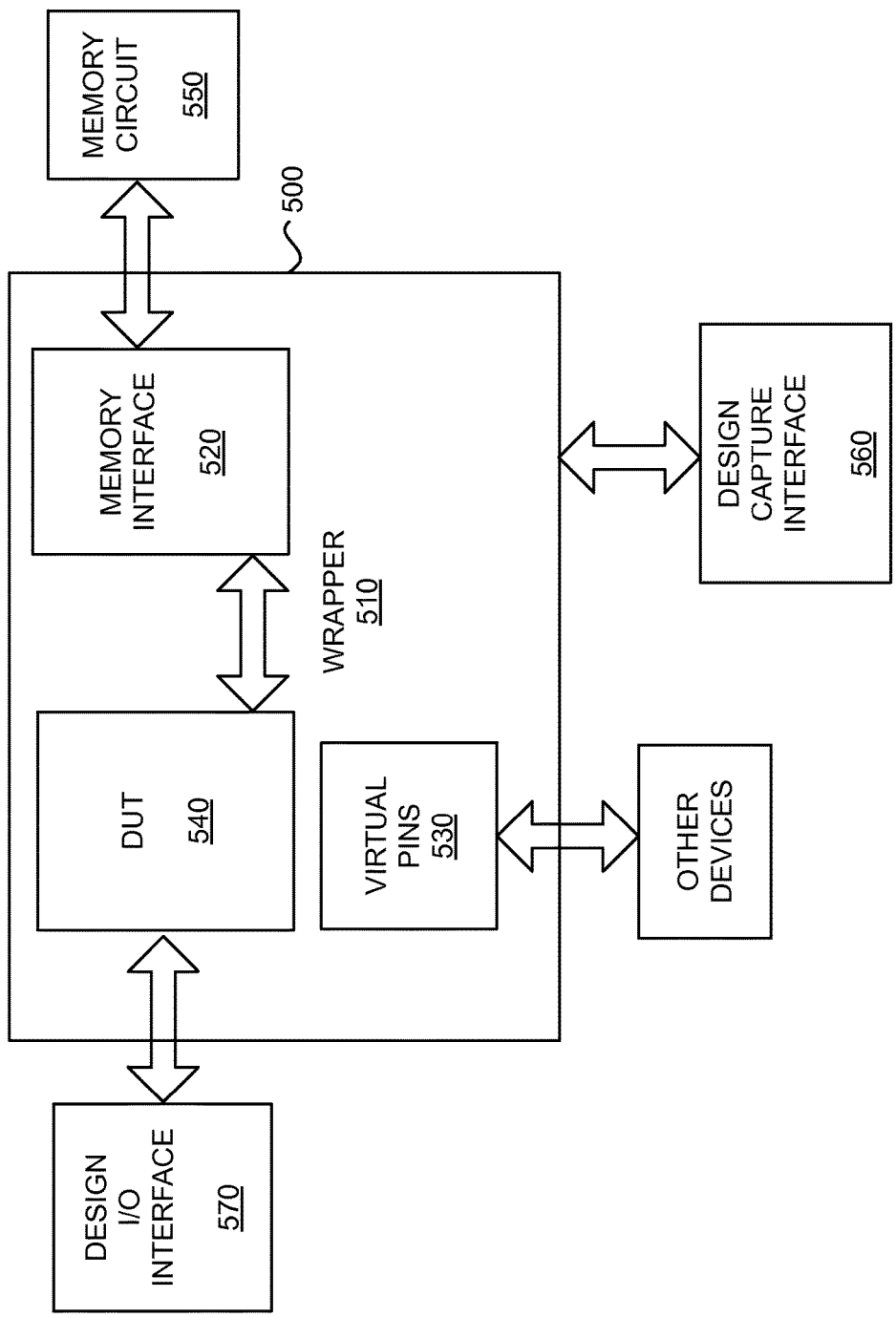
FIG. 5A is a diagram of an illustrative configurable integrated circuit used for hardware emulation in accordance with an embodiment.

As shown in FIG. 5A, integrated circuit 500 may include DUT circuit 540, memory interface 520, virtual pins 530, and wrapper circuitry 510. If desired, integrated circuit 500 may be a configurable integrated circuit such as programmable integrated circuit 100 of FIG. 1. In this case, integrated circuit 500 may receive the design implementation as a configuration file and configure integrated circuit 500 by programming programmable memory elements accordingly.

As an example, consider the scenario in which a design implementation is partly implemented by DUT 540, but the design implementation includes a memory that is bigger than the storage provided by integrated circuit 500. In this scenario, integrated circuit 500 may use memory interface 520 to connect DUT 540 to an off-chip storage circuit (e.g., memory circuit 550). The off-chip storage circuit emulates the memory in the design implementation as if the memory were included in integrated circuit 500. In this way, a fast off-chip storage circuit (e.g., a DRAM device operating at 500 MHz) may emulate a memory that is part of the design implementation of DUT 540 and that operates at a low frequency (e.g., an SRAM circuit operating at 10 MHz), when integrated circuit 500 does not include sufficient on-chip storage circuits to implement the entire memory.

A user may interact with DUT 540 through the design capture interface 560 and wrapper 510. For example, the user may perform a read-back operation or a write-back operation of a portion or of all the signals stored in the storage circuits of DUT 540 (e.g., using global control circuit 210, communication network 230, local control circuits 220, and scan chains in sectors 240 of FIG. 2). In some embodiments, the user may initiate a read-back operation at regular time intervals and/or when a trigger condition is met. If desired, the user may perform a read-back operation after each triggering event of a clock signal or after a predetermined number of triggering events of a clock signal, just to name a few possibilities.

During operation in hardware emulation mode, DUT 540 may receive input signals (e.g., from a test bench) and generate output signals in response to receiving the input signals. Design I/O interface 570 may provide these input signals to DUT 540 and receive the output signals from DUT 540.

Figure 5B:
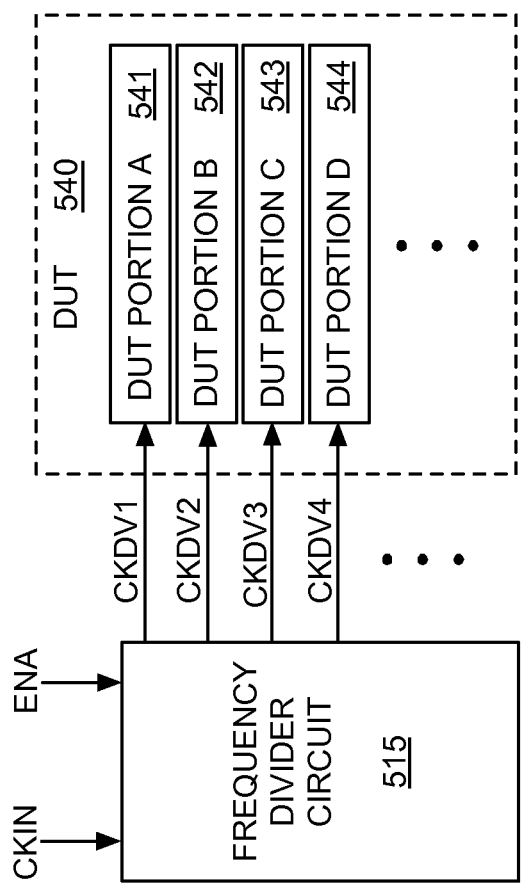
FIG. 5B is a diagram of an illustrative frequency divider circuit that generates clock signals for different portions of a design-under-test (DUT) in accordance with an embodiment.

In certain embodiments, DUT 540 may include multiple portions that may operate at different clock frequencies. FIG. 5B shows a diagram of such a DUT. As shown, DUT 540 may include DUT portion A (541), B (542), C (543), D (544), etc. Each DUT portion may be controlled by a separate clock signal. For example, DUT portion A (541) may be controlled by clock signal CKDV1, DUT portion B (542) by CKDV2, DUT portion C (543) by CKDV3, DUT portion D (544) by CKDV4, etc.

Wrapper 510 of FIG. 5A may include frequency divider circuit 515, which may generate the clock signals CKDV1, CKDV2, CKDV3, CKDV4, etc. based on clock signal CKIN and enable signal ENA. As an example, frequency divider circuit 515 may receive clock signal CKIN, which may have a frequency of 200 mega-hertz (MHz) and produce signals CKDV1, CKDV2, CKDV3, CKDV4, etc. with frequencies of 100 MHz, 50 MHZ, 25 MHz, 20 MHz, etc., respectively.

Frequency divider circuit 515 may include any analog or digital frequency divider that receives a reference clock signal (e.g., signal CKIN) and produces a periodic signal with a frequency that is harmonically related to the frequency of the reference clock signal. As an example, frequency divider circuit 515 may include a clock period counter or a shift register, just to name a few alternatives. For example, the clock period counter may suppress every other clock period of the reference clock signal, thereby producing a periodic signal that has half the frequency of the reference clock signal.

Figure 6:
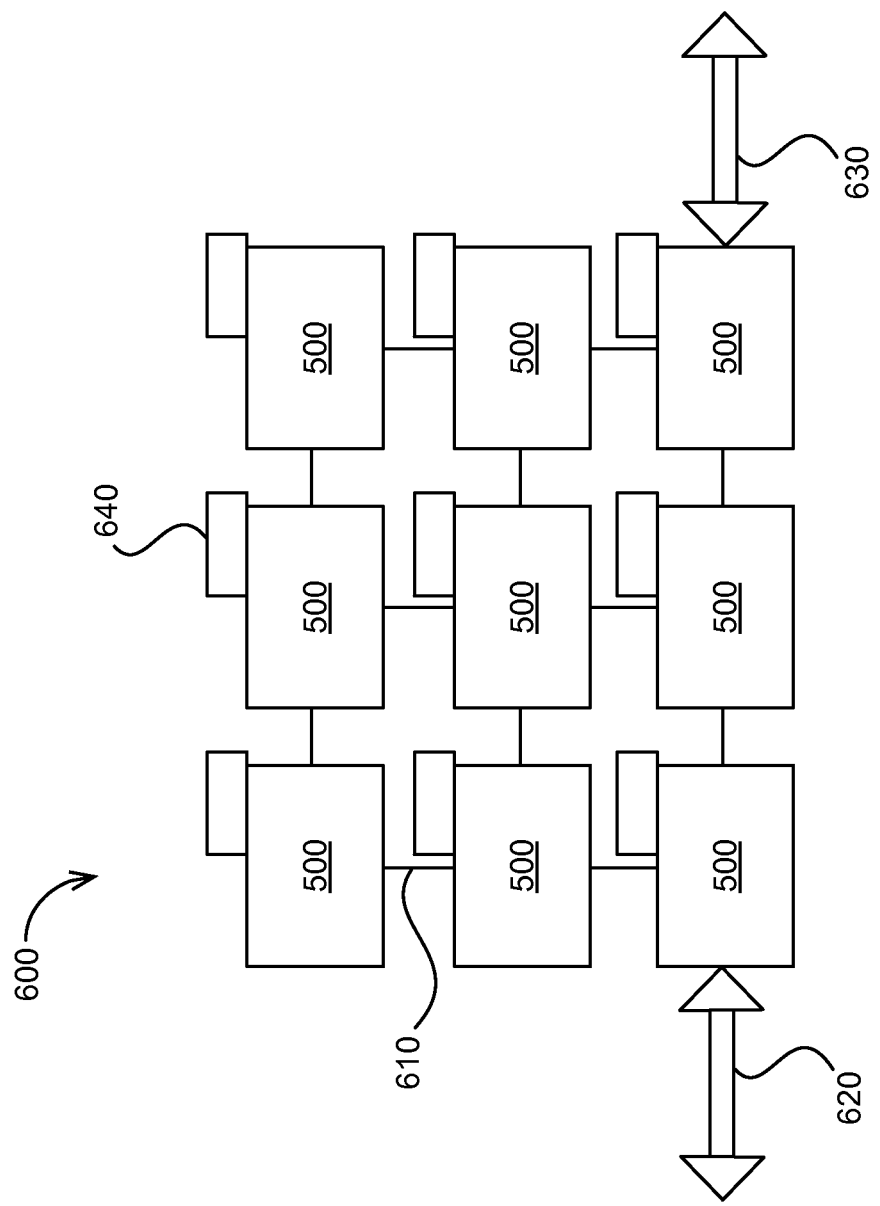
FIG. 6 is a diagram of an illustrative system with multiple interconnected configurable integrated circuits of FIG. 5A in accordance with an embodiment.

In certain embodiments, a circuit design may be implemented across multiple integrated circuits 500 (i.e., the circuit design may be partitioned into multiple portions with each portion being implemented by an instance of DUT 540 on one of the multiple integrated circuits 500). For this purpose, multiple integrated circuits 500 may be arranged on a printed circuit board (PCB) to generate a system 600 as shown in FIG. 6. If desired, multiple PCBs may be interconnected (e.g., arranged in a rack and connected through a back-plane) to create even bigger systems (not shown).

In the scenario in which the circuit design is implemented across multiple integrated circuits 500, virtual pins 530 may time-multiplex multiple signals and send these signals from DUT 540 to another portion of the circuit design that is implemented as a DUT instantiation in a neighboring integrated circuit 500 using, for example, serial interface circuitry such as low-voltage differential signaling (LVDS) or high-speed serial interface (HSSI) transceivers, just to name a few interconnect interfaces.

Interconnects 610 may convey the signals from one integrated circuit 500 to another integrated circuit 500. For example, interconnects 610 may couple a HSSI transmitter on one integrated circuit 500 to a HSSI receiver on another integrated circuit 500. As another example, interconnects 610 may couple an LVDS interface on one integrated circuit 500 to an LVDS interface on another integrated circuit 500.

If desired, external memory circuits 640 may be associated with some or all integrated circuits 500. Each of the external memory circuits 640 may be implemented in system 600 next to an associated one of integrated circuits 500. Alternatively, each of the external memory circuits 640 may be implemented in the same package as the associated integrated circuit 500 (e.g., as a 2.5 dimensional (2.5D) circuit on a silicon interposer or as a 3 dimensional (3D) circuit with stacked dies which may be bonded to the same substrate or connected by through-silicon via (TSV) connections).

Design I/O interface 620 may provide input signals to integrated circuits 500 in system 600 and receive output signals that were generated by the respective DUT instances in integrated circuits 500 in response to receiving the input signals. Users may interface with the respective DUT instances in integrated circuits 500 using design capture interface 630. For example, users may perform a read-back operation on integrated circuits 500 to retrieve the signals stored in user storage circuits on integrated circuits 500, thereby capturing the state of one or more user storage circuits.

Read-back operations may be performed using scan storage circuits as shown in FIG. 3. However, a situation may arise in which unobservable storage circuits (i.e., storage circuits that are not associated with scan storage circuits such as registers embedded in RAM blocks 130 or DSP blocks 120 of FIG. 1) implement at least some sequential elements of the DUT.

Figure 7A:
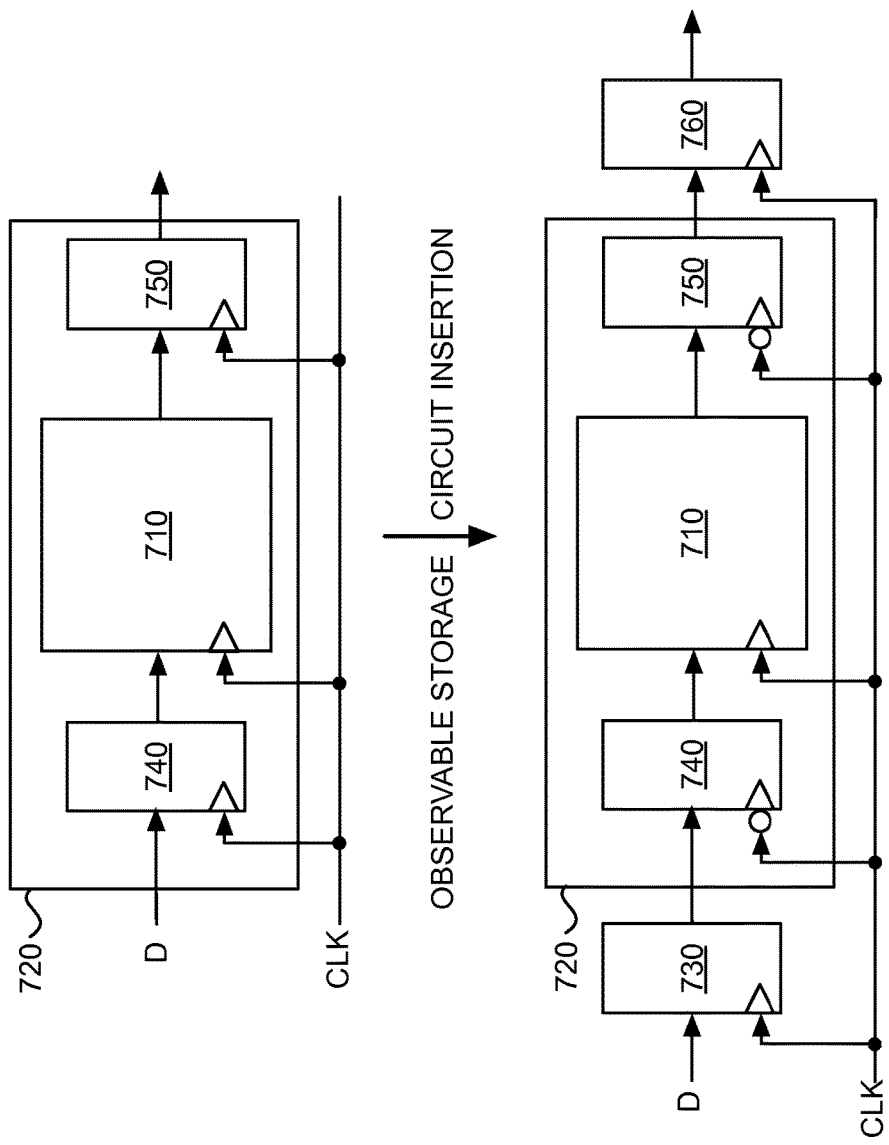
FIG. 7A is a diagram of an illustrative block with embedded sequential circuitry that is encapsulated by unobservable storage circuits that are coupled in series with observable storage circuits in accordance with an embodiment.

FIG. 7A shows an example of a circuit block such as circuit block 720 that includes unobservable storage circuits 740 and 750. As shown, circuit block 720 may include embedded sequential circuitry 710 (i.e., circuitry that is triggered by a clock signal). Embedded sequential circuitry 710 may receive a signal from unobservable storage block 740 and send a signal to unobservable storage block 750.

For example, circuit block 720 may implement a synchronous RAM block (e.g., RAM block 130 of FIG. 1) that includes a memory array 710, input registers 740, and output registers 750. In this example, address signals may be stored by input registers 740 to implement synchronous access operations to memory array 710. If desired, input and output data may be stored by input registers 740 and output registers 750, respectively for data pipelining. As another example, circuit block 720 may implement a processing block (e.g., DSP block 120 of FIG. 1) that includes an arithmetic circuit 710 with a pipelining stage, as well as input registers 740, and output registers 750 for further pipelining the data on the input and the output side, respectively.

For the purpose of a read-back operation, observable storage circuits that are accessible using scan storage circuits without traversing other storage circuits (e.g., observable storage circuits 730 and 760) may be coupled as shadow storage circuits in series with unobservable storage circuits 740 and 750, respectively. Functioning as shadow storage circuits, the observable storage circuits 730 and 760 mirror the input and the output of the unobservable storage circuits 740 and 750, respectively. On the input side, observable storage register 730 may be triggered by the same clock signal CLK as unobservable storage circuit 740. For the purpose of preserving the same latency, clock signal CLK may be inverted between observable storage circuit 730 and unobservable storage circuit 740.

Consider as an example the scenario in which observable storage circuit 730, unobservable storage circuit 740, and embedded sequential circuitry 710 are all triggered by a rising clock edge. In this scenario, observable storage circuit 730 may receive a signal D and store the data associated with signal D at the rising clock edge of clock signal CLK. Unobservable storage circuit 740 may receive signal D from observable storage circuit 730 and store the data associated with signal D at the next falling edge of clock signal CLK. Embedded sequential circuitry 710 may receive signal D from unobservable storage circuit 740 and store the data associated with signal D at the next rising edge of clock signal CLK. Thus, signal D is stored in embedded sequential circuitry 710 one clock cycle after it has been stored in observable storage circuit 730.

On the output side, observable storage register 760 may be triggered by the same clock signal CLK as unobservable storage circuit 750. For the purpose of preserving the same latency, clock signal CLK may be inverted between observable storage circuit 760 and unobservable storage circuit 750.

Consider as an example the scenario in which observable storage circuit 760, unobservable storage circuit 750, and embedded sequential circuitry 710 are all triggered by a rising clock edge. In this scenario, embedded sequential circuitry 710 may release a signal at the rising clock edge of clock signal CLK to unobservable storage circuit 750, which may store the data associated with the signal at the next falling edge of clock signal CLK. Observable storage circuit 760 may receive the signal from unobservable storage circuit 750 and store the data associated with the signal at the next rising edge of clock signal CLK. Thus, the signal is stored in observable storage circuit 760 one clock cycle after it has been released from embedded sequential circuitry 710. Thus, inserting the observable storage circuits 730 and 760 may not increase the latency through circuit block 720.

Figure 7B:
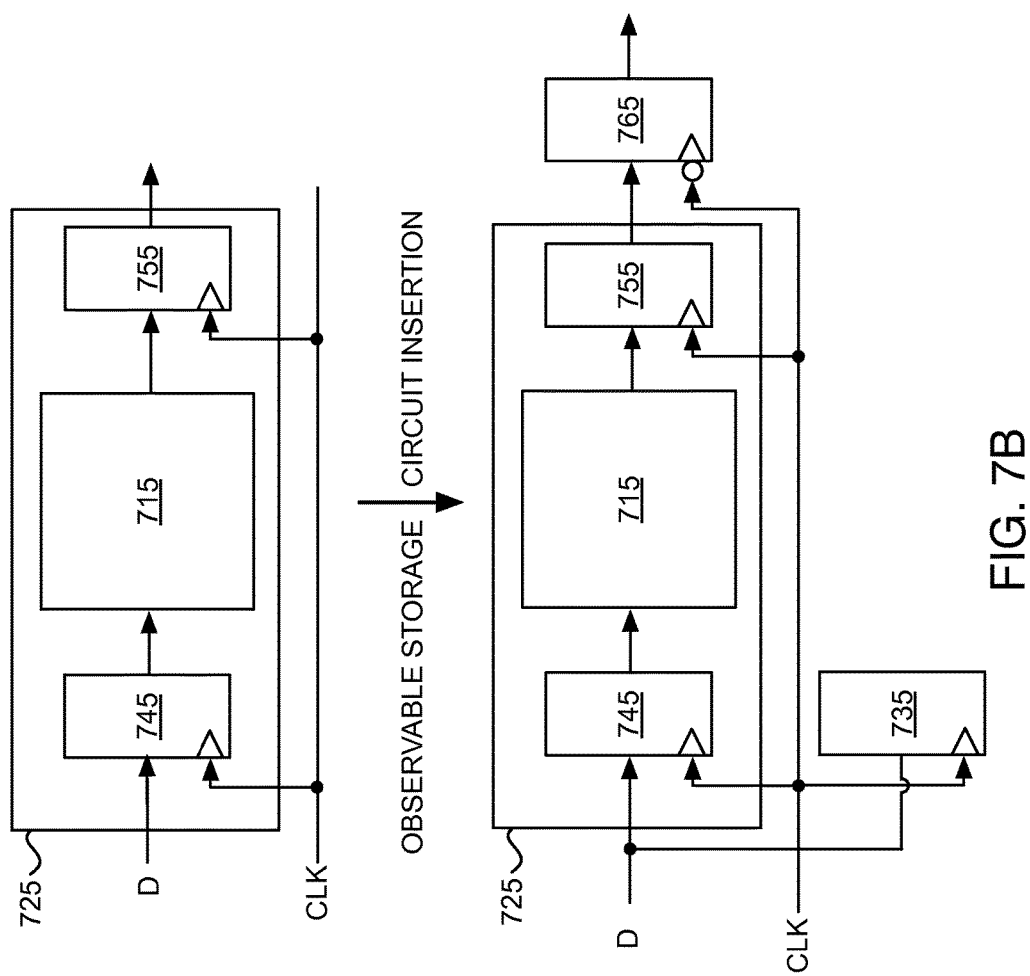
FIG. 7B is a diagram of an illustrative block with embedded combinational circuitry that is encapsulated by unobservable storage circuits that are coupled in series with observable storage circuits in accordance with an embodiment.

FIG. 7B shows another example of a circuit block such as circuit block 725 that includes unobservable storage circuits 745 and 755. As shown, circuit block 725 may include embedded combinational circuitry 715 (i.e., circuitry that implements a Boolean function that only depends on its inputs). Embedded combinational circuitry 715 may receive a signal from unobservable storage block 745 and send a signal to unobservable storage block 755.

For example, circuit block 725 may implement a processing block (e.g., DSP block 120 of FIG. 1) that includes an arithmetic circuit 715 without a pipelining stage, as well as input registers 745, and output registers 755 for pipelining the data on the input and the output side, respectively.

For the purpose of a read-back operation, observable storage circuits such as observable storage circuit 735 may be coupled in parallel and observable storage circuit 765 may be coupled in series as shadow storage circuits with unobservable storage circuits 745 and 755, respectively. Functioning as shadow storage circuits, the observable storage circuits 735 and 765 mirror the input and the output of the unobservable storage circuits 745 and 755, respectively. On the input side, observable storage register 735 may be triggered by the same clock signal CLK as unobservable storage circuit 745.

Consider as an example the scenario in which observable storage circuit 735, unobservable storage circuit 745, and embedded combinational circuitry 715 are all triggered by a rising clock edge. In this scenario, observable storage circuit 735 and unobservable storage circuit 745 may both receive a signal D and store the data associated with signal D at the rising clock edge of clock signal CLK. Embedded combinational circuitry 715 may receive signal D from unobservable storage circuit 745, process the data associated with signal D and send the processed data signal to unobservable storage circuit 755.

On the output side, unobservable storage circuit 755 may receive the processed data signal from embedded combinational circuitry 715 and store the data associated with the processed data signal at the next rising clock edge of CLK, thereby preserving one clock cycle of delay between unobservable storage circuits 745 and 755.

For the purpose of preserving the same latency, clock signal CLK may be inverted between observable storage circuit 765 and unobservable storage circuit 755. Thus, observable storage circuit 765 may receive the processed data signal from unobservable storage circuit 755 and store the data associated with the processed data signal at the next falling edge of clock signal CLK, from where the processed data signal may reach the next storage circuit in half a clock cycle. Thus, inserting the observable storage circuits may not increase the latency through circuit block 725.

The methods for inserting observable storage circuits shown in FIGS. 7A and 7B for the purpose of read-back operations are merely illustrative and not intended to limit the scope of the present invention. If desired, the methods of FIGS. 7A and 7B can be combined. For example, an observable storage circuit may be inserted in parallel (e.g., as observable storage circuit 735 on the input side of circuit block 725 in FIG. 7B) on the input side of circuit block 720 in FIG. 7A. Similarly, an observable storage circuit 730 may be inserted in series (e.g., as observable storage circuit 730 on the input side of circuit block 720 in FIG. 7A) on the input side of circuit block 725 in FIG. 7B. Observable storage circuits 730, 735, 760, and 765 are accessible using scan storage circuits that are coupled in one or more scan chains as disclosed herein with respect to FIGS. 3 and 4.

Figure 8:
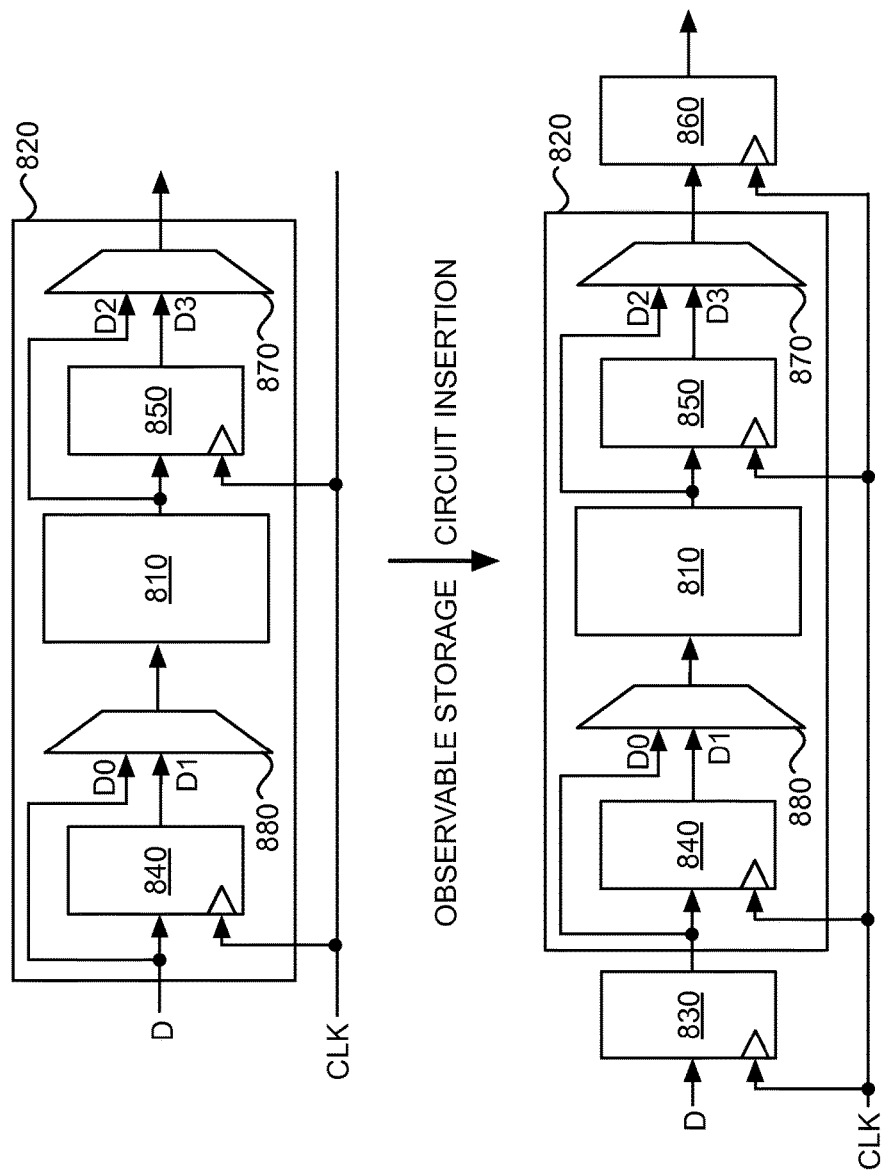
FIG. 8 is a diagram of an illustrative block with unobservable storage circuits coupled in parallel with observable storage circuits in accordance with an embodiment.

As another example, consider circuit block 820 of FIG. 8. As shown, circuit block 820 may include embedded block 810, unobservable storage blocks 840 and 850, and multiplexers 870 and 880. Consider further that multiplexer 880 selects input signal D1 and that multiplexer 870 selects input signal D3. In other words, the data associated with signal D is stored in unobservable storage circuit 840, provided to embedded block 810 via multiplexer 880, processed by embedded block 810, and stored by unobservable storage circuit 850 before leaving circuit block 820 via multiplexer 870.

In an effort to make unobservable storage blocks 840 and 850 observable during a read-back operation, observable storage blocks 830 and 860 may be inserted. Functioning as shadow storage circuits, the observable storage circuits 830 and 860 mirror the input and the output of the unobservable storage circuits 840 and 850, respectively. Multiplexer 880 may be configured to select signal D0 instead of signal D1; and multiplexer 870 may be configured to select signal D2 instead of signal D3. Thus, the data associated with signal D is stored in observable storage circuit 830, bypasses unobservable storage circuit 840, before being processed by embedded block 810. From embedded block 810, a processed signal bypasses unobservable storage circuit 850 and is stored by observable storage circuit 860. Thus, the latency from the input of observable storage circuit 830 to the output of observable storage circuit 860 after the insertion of observable storage circuits 830 and 860 is identical to the latency from the input of unobservable storage circuit 840 to the output of circuit block 820 before the insertion of observable storage circuits 830 and 860. Observable storage circuits 830 and 860 are accessible using scan storage circuits that are coupled in one or more scan chains as disclosed herein with respect to FIGS. 3 and 4.

In certain embodiments, the integrated circuit may include memory blocks (e.g., RAM block 130 of FIG. 1) that can operate at clock frequencies that are at least an order of magnitude faster than the clock frequencies at which the DUT operates. Thus, in an effort to use resources on the integrated circuit more efficiently, a wrapper (e.g., wrapper circuitry 510 of FIG. 5) may include circuitry that implements multiple memories from the circuit design on the same memory block in the integrated circuit using time-division multiplexing.

Figure 9:
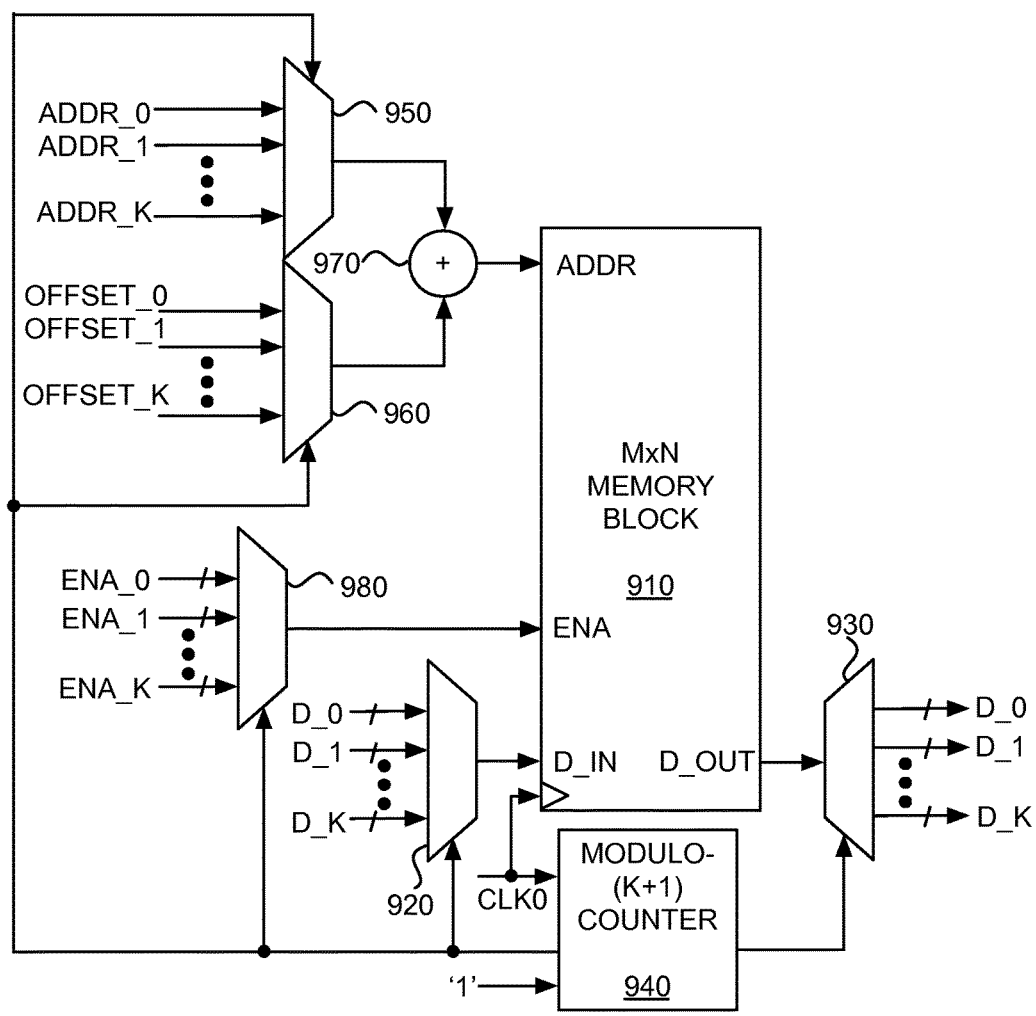
FIG. 9 is a diagram of an illustrative memory block with address decoder, data multiplexer, and data de-multiplexer that is configurable to implement shared memory and wide memory in accordance with an embodiment.

As an example, consider the wrapper circuitry around memory block 910 of FIG. 9. As shown, memory block 910 may have a depth of M-bits and a width of N-bits. If desired, memory block 910 may be configurable to implement other combinations of depth and width. For example, memory block 910 may be configured to implement a memory that has a depth of up to M×N bits and a width of one bit, a memory that has a depth of up to (M×N)/2 bits and a width of up to two bits, a memory that has a depth of up to (M×N)/4 bits and a width of up to four bits, . . . , a memory that has a depth of up to M bits and a width of up to N bits. Memory block 910 may include one, two, three, or more memory arrays that each has the same width of N-bits.

If desired, any (K+1) memories from the circuit design that have the same width (e.g., width W with W<=N) and operate on the same clock may be implemented in the same memory block 910 as long as the sum of the depth of the (K+1) memories is smaller than or equal to M multiplied with the integer division of N by W (i.e., sum of the depths of the (K+1) memories <=M×int(N/W), where int(N/W) is the result of the integer division of N by W). In other words, int(N/W) is equal to N divided by W and the result of the division rounded down to the nearest integer. As an example, consider a first memory of depth P1 and width W and a second memory of depth P2 and width W. The first memory and the second memory may be implemented in memory block 910 if both memories operate on the same clock, W<=N, and (P1+P2)<=M×int(N/W).

As shown, the wrapper circuitry around memory block 910 may include multiplexers 920, 950, 960, and 980, adder 970, de-multiplexer 930, and modulo-(K+1) counter 940. Multiplexers 920 and 950 may receive the data signals and the address signals from the (K+1) memory implementations of the circuit design, respectively. Multiplexer 960 may receive the address offset for each of the (K+1) memory implementations; and multiplexer 980 may receive the enable signals for each of the (K+1) memory implementations. De-multiplexer 930 may receive data stored in memory block 910 and send the received data along the data line that is associated with the respective memory of the (K+1) memory implementations. Modulo-(K+1) counter 940 may count the number of clock cycles and provide each of the (K+1) memory implementations access to memory block 910 once every (K+1) clock cycles by controlling de-multiplexer 930 and multiplexers 920, 950, 960, and 980.

In certain embodiments, memory block 910 may include pipeline registers similar to the pipeline registers shown in FIGS. 7A, 7B, and 8. In these embodiments, the wrapper circuitry around memory block 910 may include observable storage blocks similar to the observable storage blocks shown in FIGS. 7A, 7B, and 8.

As an example, consider the scenario in which a circuit design has a first memory that is 128 bits deep and 32 bits wide and a second memory that is 256 bits deep and 32 bits wide. Consider further that both memories operate using the same clock signal that has a frequency that is at least two times smaller than the maximum operating frequency of the targeted memory block and that the targeted memory block (e.g., memory block 910) is 512 bits deep and 32 bits wide. In this scenario, the first and second memories may be implemented on the same targeted memory block. For example, the first memory may be implemented at addresses zero to 127 and the second memory at addresses 128 to 383. Thus, the addresses of the first and second memory implementations in the targeted memory block may have offsets of zero and 128, respectively.

A modulo-2 counter (e.g., modulo-(K+1) counter 940 with K=1) may grant access to the memory block by controlling multiplexers (e.g., multiplexers 920, 950, 960, and 980) and a de-multiplexer (e.g., de-multiplexer 930) by counting clock cycles of a clock signal (e.g., clock signal CLK0) that has twice the frequency than the clock signal of the first and second memories. For example, the modulo-2 counter may output a zero, one, zero, one, zero, etc. during the first, second, third, fourth, fifth, etc. periods of the clock signal, thereby providing the first and second memory implementations access to the memory block at alternating clock cycles.

In certain embodiments, a memory of depth P and width W from the circuit design may be wider than the N-bits of memory block 910 (i.e., W>N). In this case, the memory may be divided into several memories that have a width of less than N-bits as long as the total number of bits (i.e., P×W) is smaller than or equal to the number of bits in the memory block 910 (i.e., M×N).

As an example, consider the scenario in which a circuit design has a memory that is 128 bits deep and 128 bits wide and that the targeted memory block (e.g., memory block 910) is 512 bits deep and 32 bits wide. Consider further that the memory operates using a clock signal that has a frequency that is at least four times smaller than the maximum operating frequency of the targeted memory block. In this scenario, the memory may be represented as four memory slices that are each 128 bits deep and 32 bits wide, and all four memory slices may be implemented on the same targeted memory block. For example, the first 32-bit memory slice may be implemented at addresses zero to 127, the second 32-bit memory slice at addresses 128 to 255, the third 32-bit memory slice at addresses 256 to 383, and the fourth 32-bit memory slice at addresses 384 to 511. Thus, the addresses of the first, second, third, and fourth memory slice implementations in the memory block may have offsets of zero, 128, 256, and 384, respectively.

A modulo-4 counter (e.g., modulo-(K+1) counter 940 with K=3) may grant access to the memory block by controlling multiplexers (e.g., multiplexers 920, 950, 960, and 980) and a de-multiplexer (e.g., de-multiplexer 930). For example, the modulo-4 counter may output a zero, one, two, three, zero, one, two, three, zero, etc. during the first, second, third, fourth, fifth, sixth, seventh, eighth, ninth, etc. periods of the clock signal, thereby providing the first, second, third, and fourth memory slice implementations access to the memory block once every four clock cycles.

A computer system may perform at least some of the operations presented above. For example, the computer system may generate the wrapper circuitry around memory block 910 of FIG. 9 which allows to implement a wide memory or to implement several memories of the same width in the same memory block. If desired, the computer system may insert observable storage circuits for the purpose of visualizing the state of unobservable storage circuits as shown in FIGS. 7A, 7B, and 8. In certain embodiments, the computer system may generate the circuitry around DUT 540 of FIGS. 5A and 5B. If desired, the computer system may interact with user interface 250 of FIG. 2 to perform read-back and write-back operations using the circuitry shown in FIGS. 3 and 4. In the event that the DUT is implemented using multiple integrated circuits as shown in system 600 of FIG. 6, the computer system may control the operations executed on those integrated circuits including performing read-back and write-back operations on some or all of the integrated circuits.

Figure 10:
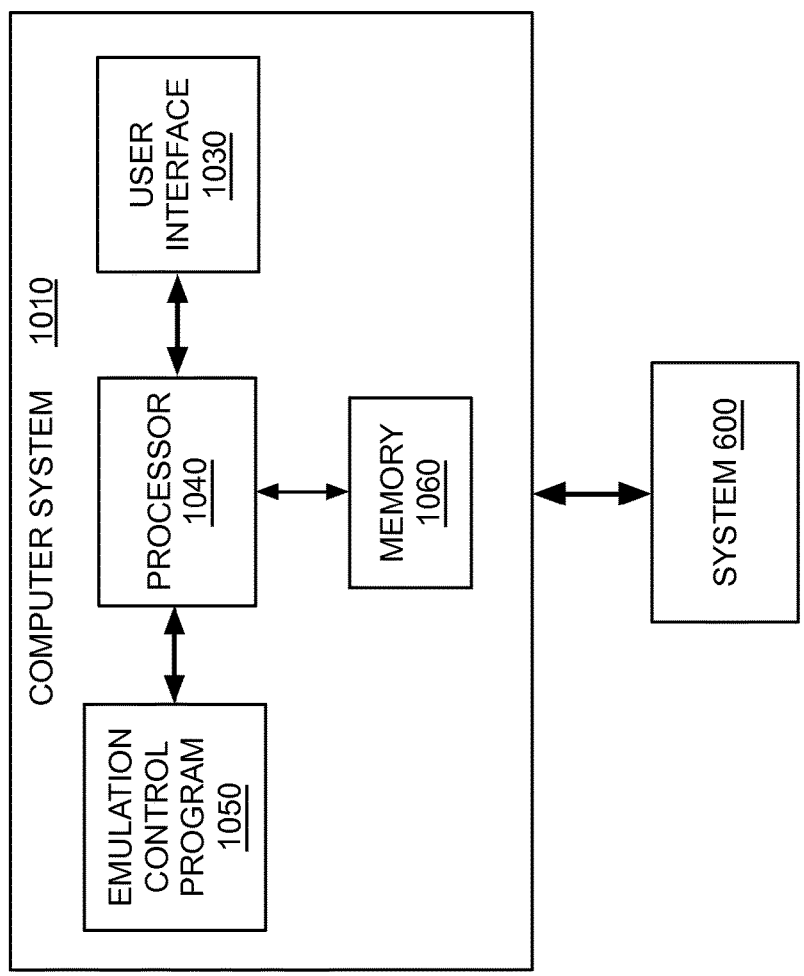
FIG. 10 is a diagram of an illustrative computer system that implements an interface with the system of FIG. 6 in accordance with an embodiment.

FIG. 10 shows an illustrative computer system that interfaces with system 600 of FIG. 6. As shown, computer system 1010 may include user interface 1030, processor 1040, emulation control program 1050, and memory 1060, interconnected together by one or more buses. Processor 1040 may be a central processing unit (CPU), microprocessor, floating-point co-processor, hardware controller, microcontroller, a programmable integrated circuit (e.g., programmable integrated circuit 100 of FIG. 1) programmed for use as a controller, network controller, or any type of processor or controller.

Memory 1060 may be a random-access memory (RAM), read-only memory (ROM), fixed or flexible disk media, flash memory, any other storage circuit, or any combination of these storage circuits. User interface 1030 may include means for a user to interact with computer system 1010 and through computer system 1010 with system 600. The user interface 1030 may include output devices and input devices. The output devices may include a display, a printer, or any other output devices, or any combination thereof. The input devices may include a keyboard, a mouse, a microphone with voice recognition, a stencil, or any other input device, or any combination thereof.

Emulation control program 1050 may include one or more programs for compiling a user's circuit design for implementation in system 600. For example, emulation control program 1050 may include a program for packing multiple memories into the same memory block as illustrated in FIG. 9, a program for inserting observable storage circuits as shadow storage circuits to unobservable storage circuits into the DUT as illustrated in FIGS. 7A, 7B, and 8, a program for generating a frequency divider circuit as shown in FIG. 5B, a program for generating a memory interface, virtual pins, and a wrapper as shown in FIG. 5A, just to name a few.

If desired, emulation control program 1050 may disable operations that involve optimizations of sequential elements when compiling the user's circuit design for implementation in system 600. For example, emulation control program 1050 may disable operations such as retiming of sequential elements, merging of sequential elements, duplication of sequential elements, modification of initial conditions of sequential elements, modification to clock enable signals that trigger sequential elements, etc.

Emulation control program 1050 may control the implementation of the circuit design on the integrated circuit such that observable storage circuits from the DUT (e.g., DUT 540 of FIG. 5) and observable storage circuits from the wrapper (e.g., wrapper 510 of FIG. 5) are not associated with scan storage circuits that are on the same scan chain. For example, consider the scenario in which user storage circuit 320A of FIG. 3 implements a sequential element of DUT 540 of FIG. 5. In this scenario, emulation control program 1050 may ensure that user storage circuit 320B does not implement a sequential element of wrapper 510 of FIG. 5.

If desired, emulation control program 1050 may generate a map that maps sequential elements from the circuit design to observable storage circuits in integrated circuit 500 or in system 600 and store the map in memory 1060. For example, a user may use the name of a sequential element to direct computer system 1010 to read-back the data stored in a given observable storage circuit by entering a command into user interface 1030. Processor 1040 may access the map in memory 1060 to look up information about the observable storage circuit that corresponds to the sequential element in the circuit design. In response to determining the information about the observable storage circuit, computer system 1010 may send a read-back request to system 600 or to a predetermined integrated circuit 500 in system 600 based on the determined information.

If desired, emulation control program 1050 may control the operation of system 600. For example, emulation control program 1050 may interact with system 600 for the purpose of performing a read-back operation or a write-back operation as disclosed with respect to FIGS. 2, 3, and 4.

Emulation control program 1050 may perform these tasks together with processor 1040 and/or memory 1060. Emulation control program 1050 may act when certain predetermined conditions are met (e.g., perform a read-back operation at fixed intervals, implement multiple memories in a memory block and as a result create a wrapper circuit) or upon request by the user through user interface 1030 (e.g., as a result of detecting a design error the user may want to perform a write-back operation to write corrected data to system 600).

Emulation control program 1050 may perform these tasks in response to option settings, which may be conveyed to computer system 1010 in the form of variables, parameters, compiler directives, macros, pragmas, or assertions, just to name a few. As an example, computer system 1010 may use a constraint file, which may include a portion or all of the constraints. Such a constraint file may be included with a design specification that includes the circuit design. In some scenarios, a portion or all of the constraints may be embedded in the circuit design. Alternatively, the constraints may have been defined using design and constraint entry tools.

Figure 11:
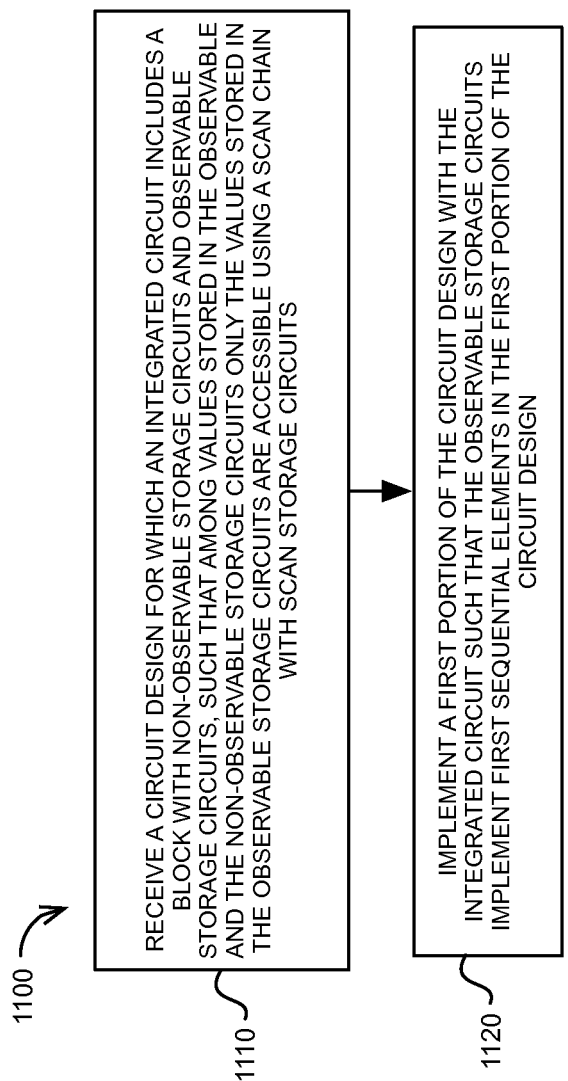
FIG. 11 is a flow chart showing illustrative operations for implementing sequential elements in a portion of a circuit design with observable storage circuits in an integrated circuit in accordance with an embodiment.

FIG. 11 is a flow chart 1100 showing examples of operations that a computer system (e.g., computer system 1010 with emulation control program 1050) may perform. During operation 1110, the computer system may receive a circuit design for which an integrated circuit (e.g., programmable integrated circuit 100 of FIG. 1) includes blocks with non-observable storage circuits (e.g., RAM blocks 130 of FIG. 1) and observable storage circuits (e.g., registers in LABs 110 of FIG. 1), such that among values stored in the observable and the non-observable storage circuits only the values stored in the observable storage circuits are accessible using a scan chain with scan storage circuits (e.g., the registers in LABs 110 of FIG. 1 may be accessible by scan storage circuits as shown in FIG. 3).

During operation 1120, the computer system may implement a first portion of the circuit design with the integrated circuit such that the observable storage circuits implement first sequential elements in the first portion of the circuit design.

Figure 12:
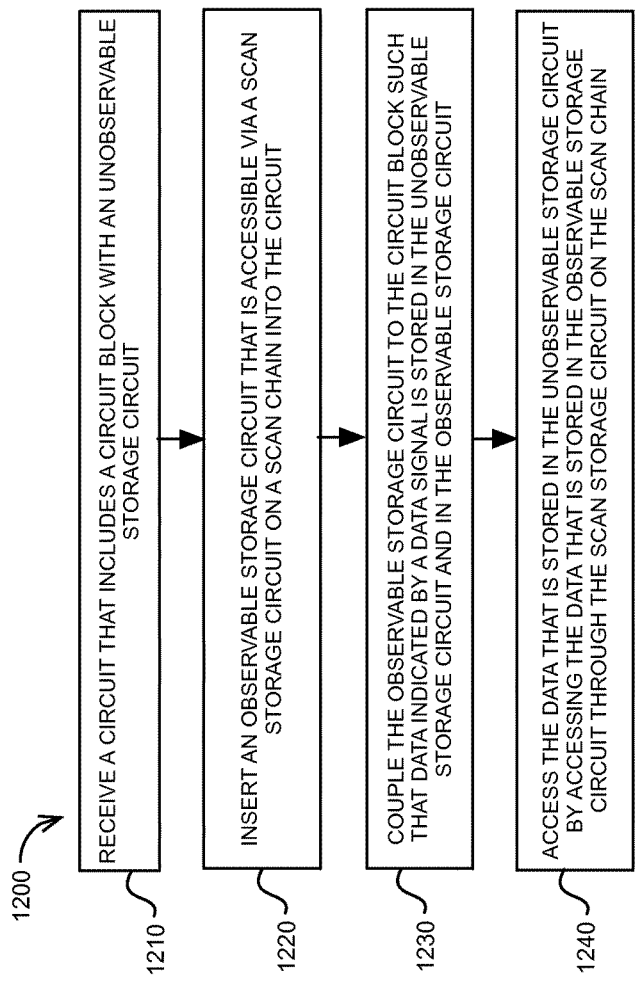
FIG. 12 is a flow chart showing illustrative operations for coupling an observable storage circuit to a circuit block with an unobservable storage circuit in accordance with an embodiment.

FIG. 12 is a flow chart 1200 showing illustrative operations that a computer system (e.g., computer system 1010 of FIG. 10) may perform to allow for accessing an unobservable storage circuit in a circuit block.

During operation 1210, the computer system may receive a circuit that includes a circuit block with an unobservable storage circuit.

During operation 1220, the computer system may insert an observable storage circuit (e.g., storage circuit 320A or 320B of FIG. 3) that is accessible via a scan storage circuit (e.g., scan storage circuit 340 or 345 of FIG. 3 or a scan storage circuit in scan chain 450 of FIG. 4) on a scan chain into the circuit.

During operation 1230, the computer system may couple the observable storage circuit to the circuit block such that data indicated by a data signal is stored in the unobservable storage circuit and in the observable storage circuit. For example, data that is stored in unobservable storage circuits 740 and 750 of FIG. 7A, and 745 and 755 of FIG. 7B is also stored in observable storage circuits 730 and 760 of FIG. 7A and 735 and 765 of FIG. 7B, respectively.

During operation 1240, the computer system may access the data that is stored in the unobservable storage circuit by accessing the data that is stored in the observable storage circuit through the scan storage circuit on the scan chain.

Figure 13:
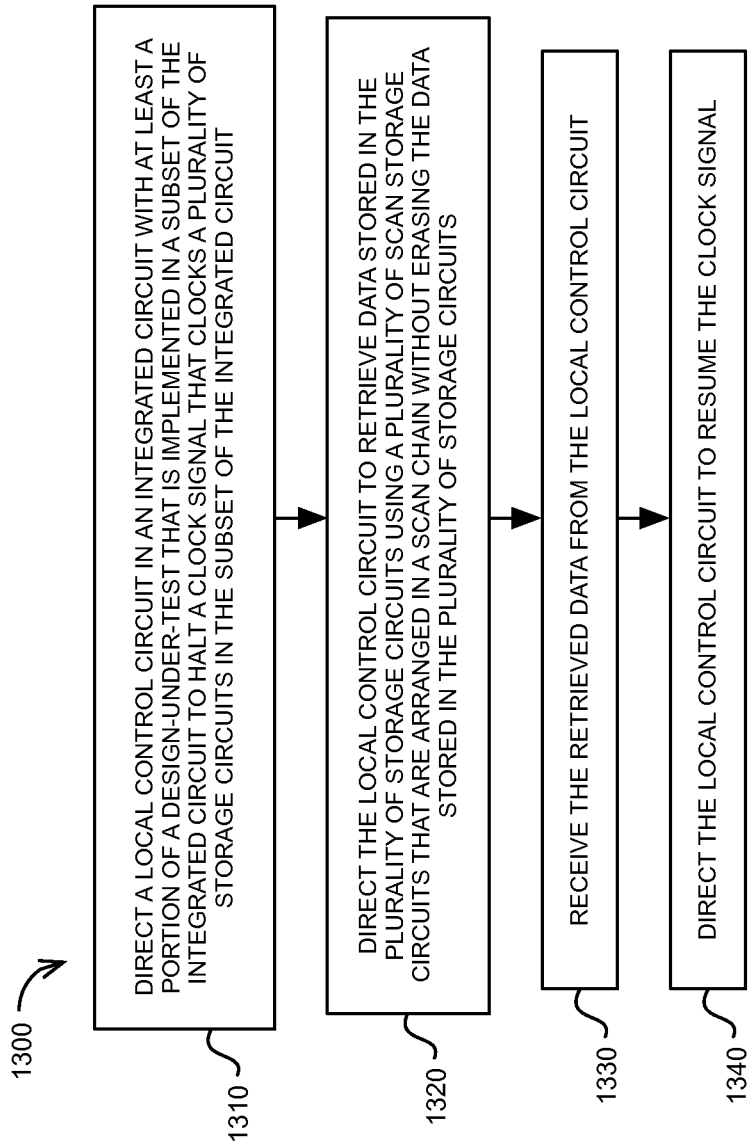
FIG. 13 is a flow chart showing illustrative operations for operating an integrated circuit that includes a processor and that implements at least a portion of a design-under-test in accordance with an embodiment.

FIG. 13 is a flow chart 1300 showing illustrative operations that may be performed through a user interface (e.g., user interface 250 of FIG. 2) when operating an integrated circuit that includes a local control circuit and implements at least a portion of a design-under-test. During operation 1310, the user interface may direct the local control circuit in the integrated circuit with at least a portion of a design-under-test that is implemented in a subset of the integrated circuit to halt a clock signal that clocks a plurality of storage circuits in the subset of the integrated circuit.

During operation 1320, the user interface may direct the local control circuit to retrieve data stored in the plurality of storage circuits using a plurality of scan storage circuits that are arranged in a scan chain without erasing the data stored in the plurality of storage circuits. During operation 1330, the user interface may receive the retrieved data from the local control circuit. During operation 1340, the user interface may direct the local control circuit to resume the clock signal.

The methods and apparatuses described herein may be incorporated into any suitable electronic device or system of electronic devices. For example, the methods and apparatuses may be incorporated into numerous types of devices such as microprocessors or other integrated circuits (ICs). Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuits described herein may be part of a data processing system that includes one or more of the following components; a processor; memory; I/O circuitry; and peripheral devices. The integrated circuits can be used in a wide variety of applications, such as computer networking, data networking, instrumentation, video processing, digital signal processing, or any suitable other application such as hardware emulation or prototyping where the advantage of performing read-back and/or write-back operations is desirable.

Although the method operations were described in a specific order, it should be understood that other operations may be performed in between described operations, described operations may be adjusted so that they occur at slightly different times or described operations may be distributed in a system that allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method, comprising:
receiving a circuit design, wherein an integrated circuit includes a block with first and second non-observable storage circuits, wherein the integrated circuit further includes first and second observable storage circuits, and wherein among values stored in the first and second observable storage circuits and the first and second non-observable storage circuits, only the values stored in the first and second observable storage circuits are accessible using a scan chain comprising scan storage circuits;
implementing at least a portion of the circuit design in the block with the first and second non-observable storage circuits;
coupling the first observable storage circuit to an input of the block, wherein the first observable storage circuit mirrors an input of the first non-observable storage circuit;
coupling the second observable storage circuit to an output of the block, wherein the second observable storage circuit mirrors an output of the second non-observable storage circuit; and
coupling embedded circuitry in the block to receive an output of the first non-observable storage circuit and to provide an input to the second non-observable storage circuit.

2. The method of claim 1,
wherein coupling the second observable storage circuit to the output of the block further comprises:
coupling the second observable storage circuit in series with the output of the block.

3. The method of claim 2,
further comprising:
coupling a first input of a first multiplexer circuit in the block to receive an output of the first observable storage circuit, a second input of the first multiplexer circuit to receive the output of the first non-observable storage circuit, and an output of the first multiplexer circuit to an input of the embedded circuitry.

4. The method of claim 3 further comprising:
coupling a first input of a second multiplexer circuit in the block to an output of the embedded circuitry, a second input of the second multiplexer circuit to the output of the second non-observable storage circuit, and an output of the second multiplexer circuit to an input of the second observable storage circuit.

5. The method of claim 1, wherein coupling the first observable storage circuit to the input of the block further comprises:
coupling the first observable storage circuit in parallel to the input of the block.

6. The method of claim 1, wherein coupling the first observable storage circuit to the input of the block further comprises:
coupling the first observable storage circuit in series with the input of the block.

7. A method, comprising:
receiving a circuit design, wherein an integrated circuit includes a block with non-observable storage circuits, wherein the integrated circuit further includes observable storage circuits, and wherein among values stored in the observable and the non-observable storage circuits, only the values stored in the observable storage circuits are accessible using a scan chain comprising scan storage circuits;
implementing a first portion of the circuit design with the integrated circuit such that the observable storage circuits implement first sequential elements in the first portion of the circuit design;
implementing a second portion of the circuit design in the block with the non-observable storage circuits by coupling an additional observable storage circuit to an input of the block, wherein the additional observable storage circuit mirrors a sequential element of second sequential elements that is included in the second portion of the circuit design, wherein a design-under-test comprises the first and second portions; and
inverting a clock signal between the additional observable storage circuit and one of the non-observable storage circuits in the block.

8. The method of claim 7, wherein implementing the first portion of the circuit design with the integrated circuit further comprises:
disabling operations that involve optimizations of the first sequential elements.

9. The method of claim 8, wherein the operations are selected from the group consisting of:
retiming of sequential elements, merging of sequential elements, duplication of sequential elements, modification of initial conditions of sequential elements, and modification to clock enable signals that trigger sequential elements.

10. The method of claim 7, further comprising:
creating a mapping between the first sequential elements and the observable storage circuits, wherein the mapping identifies a storage circuit of the observable storage circuits that implements a sequential element of the first sequential elements.

11. The method of claim 7, further comprising:
with a local control circuit, controlling the scan chain to perform a read-back operation of the observable storage circuits that implement the first sequential elements,
wherein among the values stored in the observable and the non-observable storage circuits, only the values stored in the observable storage circuits are accessible by a control circuit without erasing the values stored in the observable storage circuits.

12. The method of claim 7, wherein implementing the first portion of the circuit design with the integrated circuit further comprises:
emulating a subset of the first portion of the circuit design using an off-chip memory circuit.

13. The method of claim 12, further comprising:
creating a wrapper around the subset of the first portion of the circuit design; and
accessing the off-chip memory circuit with the wrapper using time-division multiplexing.

14. A method for accessing first and second unobservable storage circuits in a circuit block, comprising:
inserting a first observable storage circuit that is accessible via a first scan storage circuit on a scan chain into a circuit that includes the circuit block;
coupling the first observable storage circuit to an input of the circuit block such that data indicated by a data signal is stored in the first unobservable storage circuit and in the first observable storage circuit;
accessing the data that is stored in the first unobservable storage circuit by accessing the data that is stored in the first observable storage circuit through the first scan storage circuit on the scan chain;
inserting a second observable storage circuit that is accessible via a second scan storage circuit on the scan chain into the circuit;
generating a signal with embedded circuitry in the circuit block in response to the data stored in the first observable storage circuit or in the first unobservable storage circuit;
coupling the second observable storage circuit to an output of the circuit block such that data indicated by the signal generated with the embedded circuitry is stored in the second unobservable storage circuit and in the second observable storage circuit; and
accessing the data that is stored in the second unobservable storage circuit by accessing the data that is stored in the second observable storage circuit through the second scan storage circuit on the scan chain.

15. The method of claim 14, wherein the scan chain is controlled by a local control circuit, and wherein among values stored in the first and second observable storage circuits and the first and second unobservable storage circuits, only the values stored in the first and second observable storage circuits are accessible by the local control circuit using the scan chain.

16. The method of claim 15, wherein accessing the data that is stored in the first observable storage circuit through the first scan storage circuit further comprises:
with the local control circuit, controlling a read access operation of the first observable storage circuit, wherein the read access operation retrieves data from the first observable storage circuit and stores the data in the first scan storage circuit.

17. The method of claim 15, wherein accessing the data that is stored in the first observable storage circuit through the first scan storage circuit further comprises:
with the local control circuit, controlling a write access operation of the first observable storage circuit,
wherein the write access operation retrieves data from the first scan storage circuit and stores the data in the first observable storage circuit and in the first unobservable storage circuit.

18. The method of claim 14, wherein coupling the first observable storage circuit to the input of the circuit block further comprises:
coupling the first observable storage circuit in parallel with the first unobservable storage circuit.

19. The method of claim 14, wherein coupling the first observable storage circuit to the input of the circuit block further comprises:
coupling the first observable storage circuit in series with the first unobservable storage circuit.

20. The method of claim 19, further comprising:
clocking the first observable storage circuit and the first unobservable storage circuit at different clock edges of a same clock signal.

* * * * *